(12) United States Patent
Chen

(10) Patent No.: US 8,941,418 B2
(45) Date of Patent: Jan. 27, 2015

(54) DRIVING CIRCUITS WITH POWER MOS BREAKDOWN PROTECTION AND DRIVING METHODS THEREOF

(71) Applicant: MediaTek Inc., Hsin-Chu (TW)

(72) Inventor: Chun-Chi Chen, New Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/673,099

(22) Filed: Nov. 9, 2012

(65) Prior Publication Data

US 2013/0120886 A1    May 16, 2013

Related U.S. Application Data

(60) Provisional application No. 61/560,414, filed on Nov. 16, 2011, provisional application No. 61/608,959, filed on Mar. 9, 2012.

(51) Int. Cl.
*H03K 3/00* (2006.01)
*H02H 9/04* (2006.01)
*H03K 17/081* (2006.01)

(52) U.S. Cl.
CPC . *H03K 3/00* (2013.01); *H02H 9/04* (2013.01); *H03K 17/08104* (2013.01)
USPC .............................. 327/112; 326/83; 327/427

(58) Field of Classification Search
CPC .................. H03K 19/00315; H03K 19/00361; H03K 17/08104; H03K 17/164; H02M 3/3378; H02M 7/53803; H02M 7/5381
USPC ......... 327/108–112, 427, 424, 430, 432, 434, 327/84, 92, 420, 423, 448, 494, 587, 588, 327/436; 361/56, 57; 326/82, 83
See application file for complete search history.

(56) References Cited

U.S. PATENT DOCUMENTS

| | | | | |
|---|---|---|---|---|
| 5,854,560 A | * | 12/1998 | Chow | 326/27 |
| 6,008,684 A | * | 12/1999 | Ker et al. | 327/428 |
| 7,508,727 B2 | * | 3/2009 | Su et al. | 365/222 |
| 2006/0220699 A1 | * | 10/2006 | Labbe | 327/108 |

* cited by examiner

*Primary Examiner* — Lincoln Donovan
*Assistant Examiner* — Thomas Skibinski
(74) *Attorney, Agent, or Firm* — McClure, Qualey & Rodack, LLP

(57) ABSTRACT

A driving circuit is provided. The driving circuit is capable of driving a load coupled to an output node of the driving circuit. The driving circuit includes an output-stage element, a first N-type metal-oxide-semiconductor (NMOS) transistor, and a first P-type metal-oxide-semiconductor (PMOS) transistor. The output-stage element is coupled between an operation voltage source and the output node. The first NMOS transistor has a gate, a drain coupled to the output node, and a source coupled to a ground. The first PMOS transistor has a gate, a drain coupled to the ground, and a source coupled to the output node. When the first NMOS transistor begins to be turned off, the first PMOS transistor is turned on, and a voltage at the drain of the first NMOS transistor is clamped to be lower than a breakdown trigger voltage of the first NMOS transistor.

20 Claims, 4 Drawing Sheets

DRIVING CIRCUITS WITH POWER MOS BREAKDOWN PROTECTION AND DRIVING METHODS THEREOF

CROSS REFERENCE TO RELATED APPLICATIONS

This application claims the benefit of U.S. Provisional Application No. 61/560,414, filed on Nov. 16, 2011, the contents of which are incorporated herein by reference.

This application claims the benefit of U.S. Provisional Application No. 61/608,959, filed on Mar. 9, 2012, the contents of which are incorporated herein by reference.

BACKGROUND OF THE INVENTION

1. Field of the Invention

The invention relates to a driving circuit, and more particularly to a driving circuit with power metal-oxide-semiconductor (MOS) breakdown protection.

2. Description of the Related Art

FIG. 1 shows an H-bridge output stage of a driving circuit. Referring to FIG. 1, the H-bridge output stage is coupled between an operation voltage source VDD and a ground GND and used to drive a load 10 coupled between output nodes OUT10 and OUT11, such as an inductance element. The H-bridge output stage comprises four output-stage elements that are P-type metal-oxide-semiconductor (PMOS) transistors P10 and P11 and NMOS transistors N10 and N11. As known by the one skilled in the art, when the PMOS transistor P10 and the NMOS transistor N11 are turned on while the PMOS transistor P11 and the NMOS transistor N10 are turned off, a current path passing through the PMOS transistor P10, the inductance element 10, and the NMOS transistor N11 is formed to drive the inductance element 10. When the PMOS transistor P11 and the NMOS transistor N10 are turned on while the PMOS transistor P10 and the NMOS transistor N11 are turned off, a current path passing through the PMOS transistor P11, the inductance element 10, and the NMOS transistor N10 is formed to drive the inductance element 10. In this structure, when a current from the inductance element 10 flows to one of the output nodes OUT10 and OUT11 of the H-bridge output stage, the corresponding NMOS transistor may be burned.

For example, when the PMOS transistor P10 and the NMOS transistor N11 are turned on, the current from the inductance element 10 flows to the output node OUT 11. In this case, the current from the inductance element 10 may flow to the body of the NMOS transistor N11 at the time when the NMOS transistor N11 is turned off, which may trigger the parasitical NPN of the NMOS transistor N11 to be turned on, resulting in the breakdown of the NMOS transistor N11. After the NMOS transistor N11 is broken down, the NMOS transistor N11 operates as a voltage source with a holding voltage. When the PMOS transistor P11 is turned on and the holding voltage is less than the voltage of the operation voltage source VDD, the NMOS transistor N11 is burned, and the H-bridge output stage can not work any more.

Thus, it is desired to provide a drive circuit which provides power NMOS breakdown protection.

BRIEF SUMMARY OF THE INVENTION

An exemplary embodiment of a driving circuit is provided. The driving circuit is capable of driving a load coupled to an output node of the driving circuit. The driving circuit comprises an output-stage element, a first N-type metal-oxide-semiconductor (NMOS) transistor, and a first P-type metal-oxide-semiconductor (PMOS) transistor. The output-stage element is coupled between an operation voltage source and the output node. The first NMOS transistor has a gate, a drain coupled to the output node, and a source coupled to a ground. The first PMOS transistor has a gate, a drain coupled to the ground, and a source coupled to the output node.

In an embodiment, when the first NMOS transistor begins to be turned off, the first PMOS transistor is turned on, and a voltage at the drain of the first NMOS transistor is clamped to be lower than a breakdown trigger voltage of the first NMOS transistor.

The first NMOS transistor is controlled according to a first driving signal. The gate of first PMOS transistor receives a control signal. At a first time point, the first driving signal switches from a first high voltage level to a first low voltage level for turning off the first NMOS transistor. Also, at the first time point, the control signal is at a second low voltage level to turn on the first PMOS transistor. During a time period from the first time point to a second time point which is later than the first time point, the control signal changes from the second low voltage level to a second high voltage level gradually. Then, at the second time point, the first PMOS transistor is turned off by the control signal with the second high voltage level.

Another exemplary embodiment of a driving circuit is provided. The driving circuit is capable of driving a load coupled to an output node of the driving circuit. The driving circuit comprises a first output-stage element and a protection circuit coupled between the output node and a ground. The protection circuit provides a current path from the output node to the ground to guide a current from the output node and to clamp a voltage at the output node when the first output-stage element begins to be turned off.

Another exemplary embodiment of a driving method for a driving circuit is provided. The driving circuit comprises a first transistor and a second transistor coupled between an output node of the driving circuit and a ground. The driving method comprises when the first transistor begins to be turned off, turning on the second transistor to provide a current path from the output node to the ground and to clamp a voltage of the first transistor to be lower than a breakdown breakdown trigger voltage of the first transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
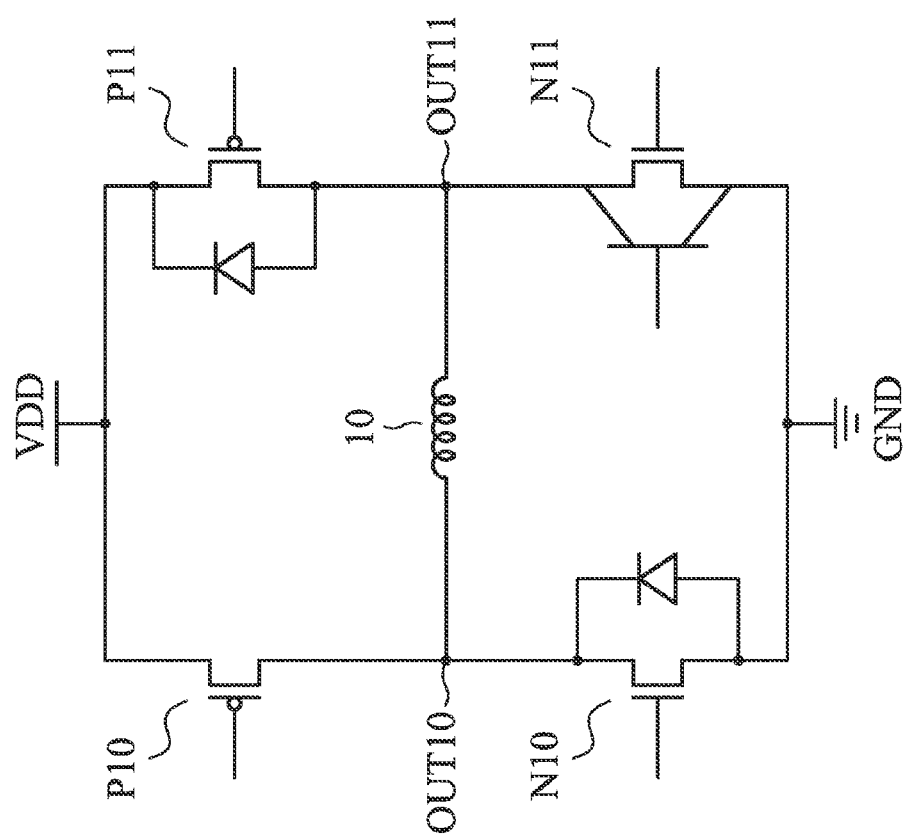
FIG. 1 shows a conventional driving circuit.
Figure 2:
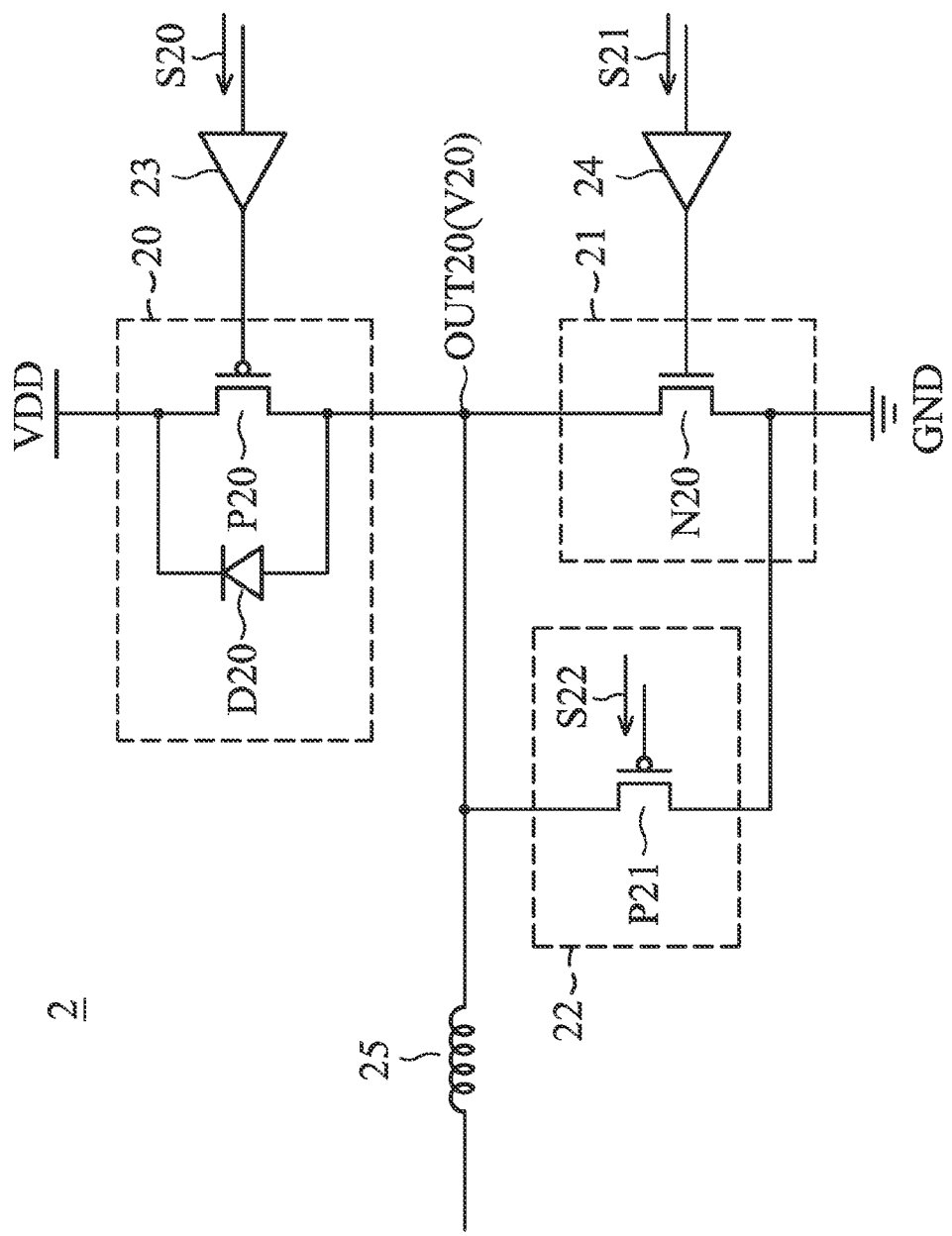
FIG. 2 shows an exemplary embodiment of a driving circuit.

Driving circuits are provided. In an exemplary embodiment shown in FIG. 2, a driving circuit 2 comprises two output-stage elements 20 and 21, a protection circuit 22, and two pre-drivers 23 and 24. The driving circuit 2 is used to drive a load 25 (such as an inductance element) which is coupled to an output node OUT20 of the driving circuit 2. In the embodiment, the output-stage element 20 is implemented by a P-type metal-oxide-semiconductor (PMOS) transistor P20, while the output-stage element 21 is implemented by an N-type metal-oxide-semiconductor (NMOS) transistor N20. A source of the PMOS transistor P20 is coupled to an operation voltage source VDD, and a drain thereof is coupled to the output node OUT20. A drain of the NMOS transistor N20 is coupled to the output node OUT20, and a source thereof is coupled to a ground GND. In FIG. 2, a diode D20 coupled in parallel with the PMOS transistor P20 represents a parasitic element of the PMOS transistor P20. The pre-drivers 23 and 24 are coupled to gates of the PMOS transistor P20 and the NMOS transistor N20 to control the gate voltages at the PMOS transistor P20 and the NMOS transistor N20 according to driving signals S20 and S21 for controlling the states of the PMOS transistor P20 and the NMOS transistor N20, respectively.

As shown in FIG. 2, the protection circuit 22 comprises a PMOS transistor P21. A source of the PMOS transistor P21 is coupled to the output node OUT20, a drain thereof is coupled to the ground GND, and a gate thereof receives a control signal S22.

Figure 3:
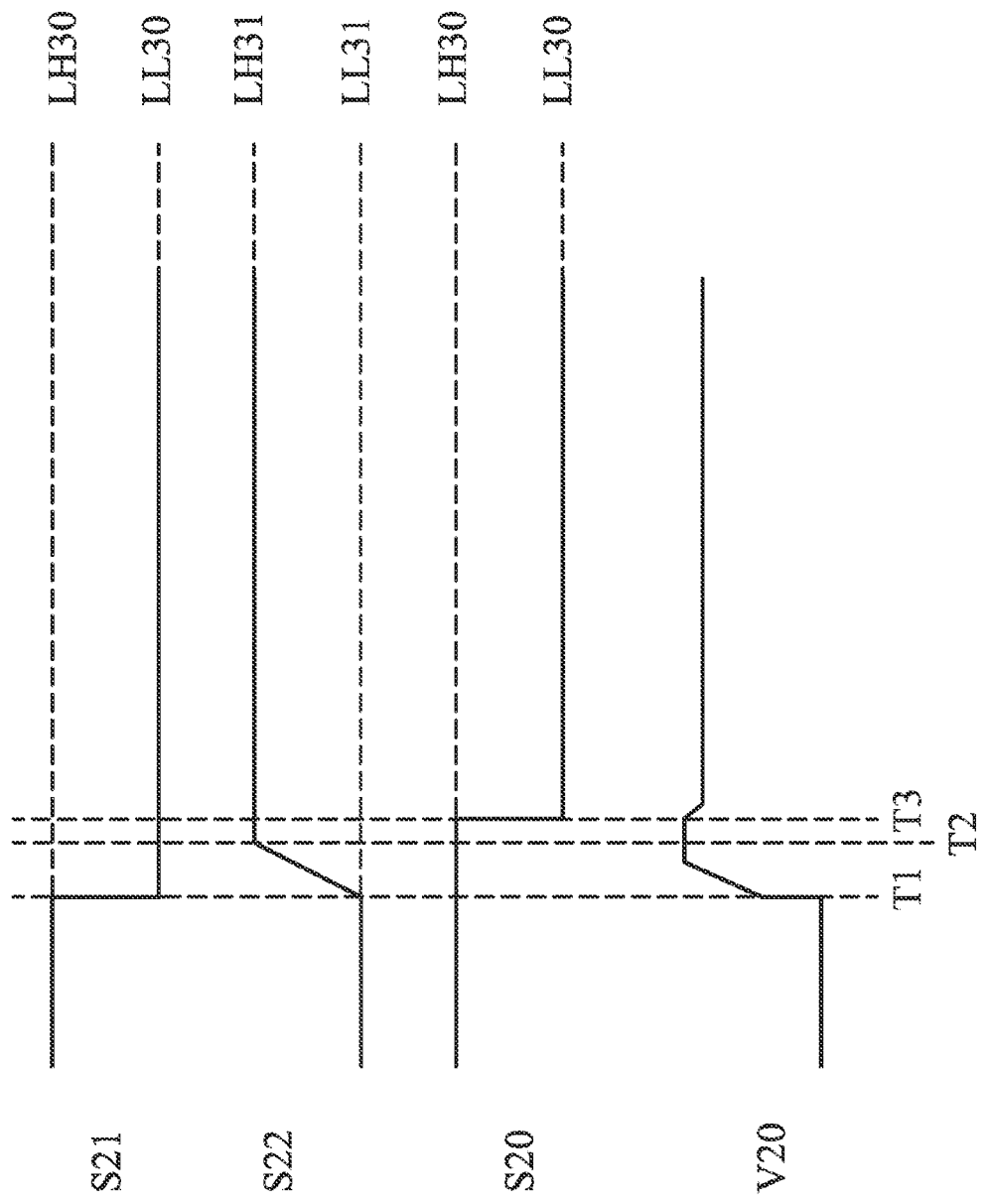
FIG. 3 show variation of main signals and voltages in FIG. 2.

FIG. 3 is a timing chart of the driving signals S20 and S21, the control signal S22, and a voltage V20 generated at the output node OUT20. As described above, the drain of the NMOS transistor N20 is coupled to the output node OUT20. Thus, the voltage V20 is also referred to as the drain voltage of the NMOS transistor N20.

In the following, the operations of the driving circuit 2 will be described according to FIGS. 2 and 3. Referring to FIGS. 2 and 3, at a time point T1, the driving signal S21 switches from a high voltage level LH30 to a low voltage level LL30, and the control signal S22 is at a low voltage level LL31 to keep the PMOS transistor P21 turned-on. Due to the parasitic capacitor between the drain and the gate of the NMOS transistor N20, the voltage, which is generated by the pre-driver 24, at the gate of the NMOS transistor N20 is not rapidly drawn to a ground level, such that the NMOS transistor N20 does not switch to be at a turned-off state rapidly. In other words, at the time point T1, the NMOS transistor N20 begins to be turned off, but not fully turned off. During the time period from the time point T1 to a time point T2 which is later than the time point T1, the control signal S22 changes from the low voltage level LL31 to a high voltage level LH31 gradually. At the time point T2, the PMOS transistor P21 is turned off by the control signal S22 with the high voltage level LH31. Moreover, at the time point T2, the voltage at the gate of the NMOS transistor N20 is drawn to the ground level, and the NMOS transistor N20 is fully turned off.

Regarding the driving signal S20, during the time period from the time point T1 to the time point T3 which is later than the time point T2, the driving signal S20 is at the high voltage level LH30, and the pre-driver 23 generates a voltage at the gate of the PMOS transistor P20 to turn off the PMOS transistor P20. At the time point T3, the driving signal S20 switches from the high voltage level LH30 to the low voltage level LL30, and the voltage which is generated by the pre-driver 23 at the gate of the PMOS transistor P20 is drawn to the ground level, such that the PMOS transistor P20 is turned on. According to the operations of the NMOS transistor N20 and the PMOS transistor P20, the NMOS transistor N20 and the PMOS transistor P20 are turned on at different time.

According to the above operation, at the time point T1, the control signal S22 is at the low voltage level LL31 to keep the PMOS transistor P21 turned-on, and the NMOS transistor N20 begins to be turned off. When a current flows from the load 25 to the output node OUT20 at the time point T1, the turned-on PMOS transistor P21 guides the current to the ground GND. During the time period from the time point T1 to the time point T2, since the control signal S22 changes from the low voltage level LL31 to the high voltage level LH31 gradually, the voltage V20 is clamped by the control signal S22 to be lower than the breakdown trigger voltage of the NMOS transistor N20. In other words, the voltage V20 changes gradually with the control signal S22, and the maximum value of the voltage V20 is less than the value of the breakdown trigger voltage of the NMOS transistor N20. At the time point T2, the voltage at the gate of the NMOS transistor N20 is fully drawn to the ground level. It is well known that the higher the voltage at the gate of the NMOS transistor N20 is, the lower the breakdown trigger voltage of the NMOS transistor N20 is; on the contrary, the lower the voltage at the gate of the NMOS transistor N20 is, the higher the breakdown trigger voltage of the NMOS transistor N20 is. Accordingly, at the time T2, the breakdown trigger voltage of the NMOS transistor N20 rises greatly due to the low voltage at the gate of the NMOS transistor N20. The voltage V20 at the time point T2 is still lower than the breakdown trigger voltage of the NMOS transistor N20, which prevents the NMOS transistor N20 from being at the breakdown state.

Figure 4:
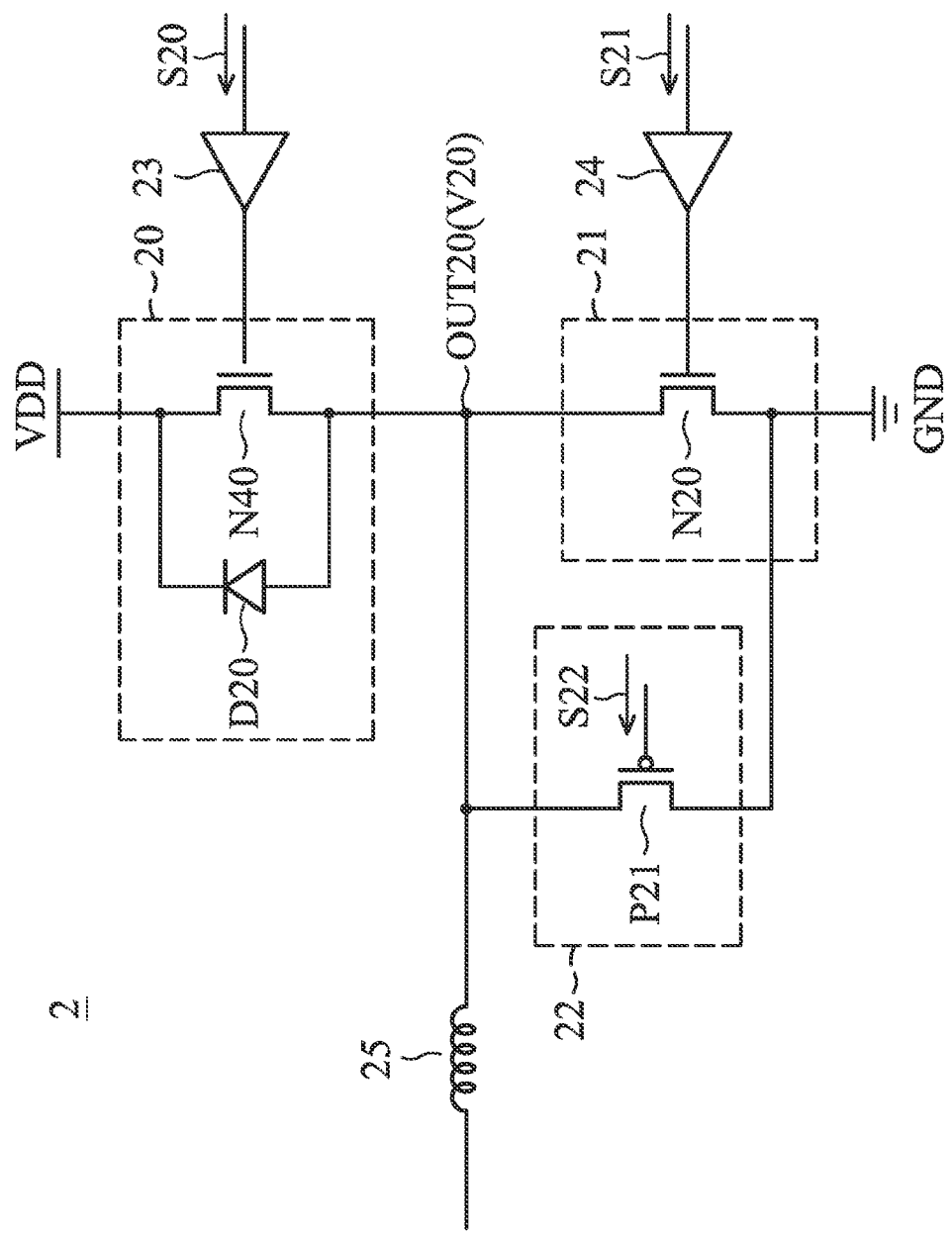
FIG. 4 shows another exemplary embodiment of a driving circuit.

In another embodiment, the output-stage element 20 is implemented by an NMOS transistor N40, as shown in FIG. 4. In the embodiment, the breakdown characteristics of the NMOS transistor N40 are better than the breakdown characteristics of the NMOS transistor N20.

In summary, the above embodiments show a mechanism for protecting the power NMOS transistor from suffering the current from the output node. When turning off the output-stage element 21 (e.g. the NMOS transistor N20) of the driving circuit 2, the proposed mechanism controls the protection circuit 22 to provide a current path from the output node OUT20 to the ground GND to guide the current from the output node OUT20. The current path guiles the current to the ground GND. The current path may be formed by drawing the gate voltage of the PMOS transistor P21 of the protection circuit 22 to a low level. The drain voltage of the NMOS transistor N20 is therefore clamped and is ensured to be less than the breakdown trigger voltage level of the NMOS transistor N20 even though the breakdown trigger voltage level is relatively low due to the high voltage level at the gate of the NMOS transistor N20. Then, when the output-stage elements 21 (e.g. the NMOS transistor N20) is fully turned off, the current path provided by the protection circuit 22 is disabled by, for example, pulling the gate voltage of the PMOS transistor P21 to a high level to turn off the PMOS transistor P21. Since the breakdown trigger voltage level of the NMOS transistor N20 is relatively high now due to the low voltage level at its gate terminal, the NMOS transistor N20 will not easily enter the breakdown state, and thereby the power NMOS transistor of the driving circuit 2 is protected.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit for driving a load coupled to an output node of the driving circuit, comprising:
   an output-stage element coupled between an operation voltage source and the output node;
   a first N-type metal-oxide-semiconductor (NMOS) transistor having a gate, a drain coupled to the output node, and a source coupled to a ground and controlled according to a first driving signal; and
   a first P-type metal-oxide-semiconductor (PMOS) transistor having a gate, a drain coupled to the ground, and a source coupled to the output node and controlled according to a control signal,
   wherein at a first time point, the first driving signal switches from a first high voltage to a first low voltage level, and the control signal is at a second low voltage, and
   wherein during a time period from the first time point to a second time point which is later than the first time point, the first driving signal remains at the first low voltage level, and the control signal changes from the second low voltage level to a second high voltage level gradually.

2. The driving circuit as claimed in claim 1, wherein a voltage at the drain of the first NMOS transistor is clamped to be lower than a breakdown trigger voltage of the first NMOS transistor.

3. The driving circuit as claimed in claim 1,
   wherein the first NMOS transistor begins to be turned off at the first time point and is fully turned off at the second time point,
   wherein the first PMOS transistor is turned on at the first time point and turned off by the control signal with the second high voltage level at the second time point.

4. The driving circuit as claimed in claim 3 further comprising:
   a first pre-driver, coupled to the gate of the first NMOS transistor, for receiving the first driving signal and controlling the first NMOS transistor according to the first driving signal.

5. The driving circuit as claimed in claim 4 further comprising:
   a second pre-driver, coupled to the output-stage element, for receiving a second driving signal and controlling the output-stage element according to the second driving signal.

6. The driving circuit as claimed in claim 5, wherein the output-stage element is implemented by a second PMOS transistor, and the second driving signal is at a third low voltage level to turn on the second PMOS transistor after the second time point.

7. The driving circuit as claimed in claim 1, wherein the output-stage element is implemented by a second PMOS transistor, and the first NMOS transistor and the second PMOS transistor are turned on at different time.

8. The driving circuit as claimed in claim 1, wherein the output-stage element is implemented by a second NMOS transistor, and breakdown characteristics of the second NMOS transistor are better than the breakdown characteristics of the first NMOS transistor.

9. A driving circuit for driving a load coupled to an output node of the driving circuit, comprising:
   a first output-stage element coupled between the output node and a ground; and
   a protection circuit coupled between the output node and the ground, for providing a current path from the output node to the ground to guide a current from the output node and to clamp a voltage at the output node during a time period at which the first output-stage element changes from a turned-on state to a turned-off state.

10. The driving circuit as claimed in claim 9, wherein the protection circuit comprises a P-type metal-oxide-semiconductor (PMOS) transistor, and when the first output-stage element begins to be turned off, the PMOS transistor is turned on to guide the current to the ground and clamps the voltage at the output node.

11. The driving circuit as claimed in claim 10,
    wherein the first output-stage element is controlled according to a first driving signal, and the gate of PMOS transistor receives a control signal,
    wherein at a first time point, the first driving signal switches for turning off the first output-stage element,
    wherein at the first time point, the control signal is at a low voltage level to turn on the PMOS transistor,
    wherein during a time period from the first time point to a second time point which is later than the first time point, the control signal changes from the low voltage level to a high voltage level gradually, and
    wherein at the second time point, the PMOS transistor is turned off by the control signal with the high voltage level.

12. The driving circuit as claimed in claim 11 further comprising:
    a first pre-driver, coupled to the first output-stage element, for receiving the first driving signal and controlling the first output-stage element according to the first driving signal.

13. The driving circuit as claimed in claim 12 further comprising:
    a second output-stage element couple between the output node and an operation voltage source; and
    a second pre-driver, coupled to the second output-stage element, for receiving a second driving signal and controlling a state of the second output-stage element according to the second driving signal.

14. The driving circuit as claimed in claim 13, wherein the second driving signal is arranged to turn on the second output-stage element after the second time point.

15. The driving circuit as claimed in claim 9, wherein the first output-stage element and the protection circuit are turned on at different time.

16. A driving method for a driving circuit comprising a first transistor and a second transistor coupled between an output node of the driving circuit and a ground, the method comprises:
    during a time period at which the first transistor charges from a turned-on state to a turned-off state, turning on the second transistor to provide a current path from the output node to the ground and to clamp a voltage of the first transistor to be lower than a breakdown trigger voltage of the first transistor.

17. The driving method as claimed in claim 16,
    wherein at a first time point, the first transistor begins to be turned off and the second transistor is turned on, and
    wherein during a time period from the first time point to a second time point which is later than the first time point, the second transistor is gradually turned off.

18. The driving method as claimed in claim 17, wherein the breakdown trigger voltage level of the first transistor at the second time point is higher than that at the first time point.

19. The driving method as claimed in claim 17, wherein the driving circuit further comprises an output-stage element coupled between the output node and an operation voltage source, and the output-stage element is turned on after the second time point.

20. The driving method as claimed in claim 16, wherein the first transistor and the second transistor are turned on at different time.

* * * * *